United States Patent
Laubacher

(10) Patent No.: US 7,292,030 B2
(45) Date of Patent: Nov. 6, 2007

(54) METAL SHIELD ALARM IN A NUCLEAR QUADRUPOLE RESONANCE/X-RAY CONTRABAND DETECTION SYSTEM

(75) Inventor: Daniel B. Laubacher, Wilmington, DE (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 0 days.

(21) Appl. No.: 11/642,418

(22) Filed: Dec. 19, 2006

(65) Prior Publication Data

US 2007/0229069 A1    Oct. 4, 2007

Related U.S. Application Data

(63) Continuation of application No. 11/302,561, filed on Dec. 13, 2005.

(60) Provisional application No. 60/635,527, filed on Dec. 13, 2004.

(51) Int. Cl.
G01V 3/00 (2006.01)

(52) U.S. Cl. ...................... 324/300; 324/307

(58) Field of Classification Search .............. 324/300, 324/307
See application file for complete search history.

(56) References Cited

U.S. PATENT DOCUMENTS

| | | |
|---|---|---|
| 3,373,348 A | 3/1968 | Vanier et al. |
| 3,764,892 A | 10/1973 | Rollwitz |
| 4,027,768 A | 6/1977 | Riessen |
| 4,072,768 A | 2/1978 | Fraser et al. |
| 5,135,908 A | 8/1992 | Yang et al. |
| 5,258,710 A | 11/1993 | Black et al. |
| 5,418,213 A | 5/1995 | Tanaka et al. |
| 5,814,992 A | 9/1998 | Busse-Gravitz et al. |
| 5,872,080 A | 2/1999 | Arendt et al. |
| 5,952,269 A | 9/1999 | Ma et al. |
| 6,088,423 A * | 7/2000 | Krug et al. .................. 378/57 |
| 6,541,966 B1 * | 4/2003 | Keene ........................ 324/243 |
| 6,617,591 B1 | 9/2003 | Simonson et al. |
| 6,653,917 B2 | 11/2003 | Kang et al. |
| 6,751,847 B1 | 6/2004 | Brey et al. |
| 6,822,444 B2 | 11/2004 | Lai |
| 6,847,208 B1 * | 1/2005 | Crowley et al. ............ 324/300 |

(Continued)

FOREIGN PATENT DOCUMENTS

EP    1 122 550 A1    8/2001

(Continued)

OTHER PUBLICATIONS

Bendall, et al., "Elimination of Coupling between Cylindrical Transmit Coils and Surface-Receive Coils for in Vivo NMR" Magnetic Resonance in Medicine v3 pp. 157-163, 1986.

(Continued)

Primary Examiner—Louis M. Arana

(57) ABSTRACT

This invention relates to a combined nuclear quadrupole resonance and X-ray contraband detection system with a metal shield alarm that is activated when the area of the metal in the object being scanned as determined by the resonance frequency shifts of the NQR sensors exceeds the area of the metal in the object being scanned as determined by X-rays by an amount sufficient to shield contraband.

24 Claims, 1 Drawing Sheet

U.S. PATENT DOCUMENTS

| | | | |
|---|---|---|---|
| 6,952,163 | B2 | 10/2005 | Muey et al. |
| 6,956,476 | B2* | 10/2005 | Buess et al. ............... 340/540 |
| 6,958,608 | B2 | 10/2005 | Takagi et al. |
| 7,049,814 | B2* | 5/2006 | Mann ......................... 324/300 |
| 7,106,058 | B2 | 9/2006 | Wilker et al. |
| 2002/0156362 | A1 | 10/2002 | Bock et al. |
| 2003/0020553 | A1 | 1/2003 | Gao et al. |
| 2003/0119677 | A1 | 6/2003 | Qiyan et al. |
| 2003/0136920 | A1 | 7/2003 | Flores et al. |
| 2004/0124840 | A1 | 7/2004 | Reykowski |
| 2004/0251902 | A1 | 12/2004 | Takagi et al. |
| 2005/0104593 | A1 | 5/2005 | Laubacher et al. |
| 2005/0122109 | A1 | 6/2005 | Wilker et al. |
| 2005/0140371 | A1 | 6/2005 | Alvarez et al. |
| 2005/0146331 | A1 | 7/2005 | Flexman et al. |
| 2005/0206382 | A1 | 9/2005 | Laubacher et al. |
| 2005/0248345 | A1 | 11/2005 | Alvarez |
| 2005/0258831 | A1 | 11/2005 | Alvarez |
| 2005/0264289 | A1 | 12/2005 | Alvarez |
| 2005/0270028 | A1 | 12/2005 | Alvarez |
| 2006/0012371 | A1 | 1/2006 | Laubacher et al. |
| 2006/0038563 | A1* | 2/2006 | Chisholm et al. ........... 324/309 |
| 2006/0082368 | A1 | 4/2006 | McCambridge |
| 2006/0119360 | A1 | 6/2006 | Yamamoto et al. |

FOREIGN PATENT DOCUMENTS

| | | |
|---|---|---|
| EP | 1 416 291 | 5/2004 |
| EP | 1 477 823 A | 11/2004 |
| JP | 05 269108 | 10/1993 |
| JP | 07 265278 | 10/1995 |
| WO | WO92/17793 | 10/1992 |
| WO | WO92/17794 | 10/1992 |
| WO | WO96/39636 | 12/1996 |
| WO | WO 02/082115 A2 | 10/2002 |
| WO | WO 04/001454 A | 12/2003 |
| WO | WO 2004/102596 | 11/2004 |
| WO | WO 2005/059582 A1 | 6/2005 |

OTHER PUBLICATIONS

Black, et al., "A High-Temperature Superconducting Receiver For Nuclear Magnetic Resonance Microscopy", Science, vol. 259, pp. 793-795 Feb. 5, 1993.

Black, et al., "Performance Of A High-Temperature Superconducting Resonator For High-Field Imaging", Journal Of Magnetic Resonance, pp. 74-80 (1995).

Colton, et. al., "Making the World a Safer Place", Science, v.299, i.5611, pp. 1324-1325, Feb. 2006.

Fisher, et al., "A Versatile Computer-Controlled Pulsed Nuclear Quadrupole Resonance Spectrometer", Review of Scientific Instruments, v70, No. 12, p. 4678, Dec. 1999.

Hill, "Improved Sensitivity of NMR Spectroscopy Probes By Use Of High-Temperature Superconductive Detection Coils", IEEE Transactions On Applied Superconductivity, vol. 7, pp. 3750-3753, Jun. 1997.

Withers, et al., "Thin-Film HTD Probe Coils For Magnetic-Resonance Imaging", IEEE Transactions On Applied Superconductivity, vol. 3, pp. 2450-2453, Mar. 1993.

Landers, et al., "Electronic Effects and Molecular Motion in β-Octahydro-1,3,5,7-tetranitro-1,3,5,7-tetrazocine Bases on $^{14}$N Nuclear Quadrupole Resonance Spectroscopy", American Chemical Society, *J. Phys. Chem.*, 85, pp. 2618-2623, 1981.

Karpowicz, et. Al., "Librational Motion of Hexahydro-1,3,5-trinitro-s-triazine Based on the Temperature Dependence of the Nitrogen-14 Nuclear Quadrupole Resonance Spectra: The Relationship to Condensed-Phase Thermal Decomposition", American Chemical Society, *J. Phys. Chem.* 87, pp. 2109-2112, 1983.

Volpicelli, et al., "Locked rf Spectrometer for Nuclear Quadrupole Resonance", The Review of Scientific Instruments, v.25, No. 2, pp. 150-153, Feb. 1965.

Benedek, et al., "Precise Nuclear Resonance Thermometer", The Review of Scientific Instruments, v.28, No. 2, pp. 92-95, Feb. 1957.

Ernst, "Magnetic Resonance with Stochastic Excitation", Journal of Magnetic Resonance 3, pp. 10-27, 1970.

Klainer, et al., "Fourier Transform Nuclear Quadrupole Resonance Spectroscopy", Fourier, Hadamard, and Hilbert Transforms in Chemistry, pp. 147-182, 1982.

* cited by examiner

US 7,292,030 B2

METAL SHIELD ALARM IN A NUCLEAR QUADRUPOLE RESONANCE/X-RAY CONTRABAND DETECTION SYSTEM

This application is a continuation filed under 37 C.F.R. § 1.53(b) of copending application Ser. No. 11/302,561, filed Dec. 13, 2005 (CL-2896), which itself claims the benefit of and incorporates the entirety of U.S. Provisional Application No. 60/635,527, filed Dec. 13, 2004.

TECHNICAL FIELD

This invention relates to the activation of an alarm to signal the possible presence of metal shielded contraband in a detection system that combines nuclear quadrupole resonance sensors and an X-ray detection system.

BACKGROUND

X-rays are currently used to scan luggage in security systems. Typically, a dual-energy X-ray system is used to distinguish organic, inorganic and metal materials. Most explosives, biological agents that can be used for bioterrorism, and drugs (controlled substances) fall within the broad organic materials category. Since the X-ray system does not specifically identify chemical compositions, detection of organic materials can result in false positives and the need for further examination.

The use of nuclear quadrupole resonance (NQR) as a means of detecting explosives, drugs and other contraband has been recognized for some time; see, e.g., T. Hirshfield et al, *J. Molec. Struct.* 58, 63 (1980); A. N. Garroway et al, *Proc. SPIE* 2092, 318 (1993); and A. N. Garroway et al, *IEEE Trans. on Geoscience and Remote Sensing* 39, 1108 (2001). NQR provides some distinct advantages over other detection methods. NQR requires no external magnet such as required by nuclear magnetic resonance, and NQR is sensitive to the compounds of interest, i.e. there is a specificity of the NQR frequencies. Since NQR provides this specificity it can identify particular compositions, e.g. specific explosives, biological agents that can be used for bioterrorism, and drugs.

A NQR detection system can have one or more dual-purpose coils that serve as both excitation and receive coils, or it can have separate coils that only excite and only receive. An excitation, i.e. transmit, coil of a NQR detection system provides a radio frequency (RF) magnetic field that excites the quadrupole nuclei in the sample and results in their producing their characteristic resonance signals that the receive coil, i.e. sensor, detects.

It can be especially advantageous to use a sensor made of a high temperature superconductor (HTS) rather than copper since the HTS self-resonant coil has a quality factor Q of the order of $10^3$-$10^6$. The NQR signals have low intensity and short duration. In view of the low intensity NQR signal, it is important to have a signal-to-noise ratio (S/N) as large as possible. The signal-to-noise ratio is proportional to the square root of Q so that the use of a HTS self-resonant coil as a sensor results in an increase in S/N by a factor of 10-100 over that of a copper coil. Therefore, the use of a high temperature superconductor coil with a large Q as the sensor provides a distinct advantage over the use of an ordinary conductor coil.

A combined nuclear quadrupole resonance and X-ray detection system provides the existing detection capabilities of the X-ray system with the specific compound detection capabilities of the NQR system. Particular contraband can be unequivocally detected by NQR. This eliminates the uncertainty connected with false positives of the X-ray system. The detection of sheet explosives is one of the capabilities of the NQR system.

The metal shielding of contraband such as explosives, biological agents that can be used for bioterrorism, and drugs can present a problem to both X-ray and NQR detection systems. A thick metal shield will be detected by an X-ray system and prompt further examination. However, a thin metal shield will be essentially transparent to X-rays. For a NQR system, a metal shield as thin as a 25μ thick aluminum foil will prevent detection by identification of a particular NQR frequency that is characteristic of a particular target substance. Sheet explosive is one type of contraband for which thin metal shielding might be used.

An object of the present invention is to provide a combined nuclear quadrupole resonance and X-ray detection system with a metal shield alarm that will signal the existence of metal not detected by X-ray and of sufficient area to shield contraband, e.g. sheet explosives, from NQR detection.

SUMMARY

One embodiment of this invention is a detection system to scan an object that includes (a) at least one pair of sensors to detect nuclear quadrupole resonance in the object, (b) an X-ray system to determine the presence of metal in the object, and (c) an alarm that is activated when the area of metal in the object, as determined by resonance frequency shifts of the sensors, exceeds the area of the metal in the object, as determined by X-ray, by at least a pre-selected amount.

The combined nuclear quadrupole resonance and X-ray contraband detection system is typically comprised of a tunnel through which the object to be scanned passes. Preferably, each sensor is placed along a side of the tunnel with the normal to the plane of the sensor perpendicular to the axis of the tunnel. Each sensor in a pair of sensors is arranged directly opposite the other sensor in the pair, with one sensor of a pair placed on one side of the tunnel, and the other sensor of a pair placed on the opposite side of the tunnel, and with the normals to the planes of the two sensors of a pair being collinear and the planes of the sensors being parallel.

Preferably, the sensors are high temperature superconductor self-resonant coils. Most preferably, the sensors are high temperature superconductor self-resonant planar coils.

Preferably, the sensors only detect NQR signals, and separate transmit coils are provided that only excite nuclear quadrupole nuclei.

Another embodiment of this invention is a method for scanning an object to determine the presence therein of a target substance shielded by metal, by:

(a) scanning the object with X-rays to determine the area of metal contained in the object;
(b) scanning the object to determine the area of metal contained in the object as measured by the resonance frequency shifts of at least one pair of nuclear quadrupole resonance sensors;
(c) comparing the size of the area of metal determined in step (a) with the size of the area determined in step (b); and
(d) activating an alarm if the area determined in step (b) exceeds the area determined in step (a) by at least a pre-selected amount.

BRIEF DESCRIPTION OF THE DRAWINGS

This invention will be more fully understood from the following detailed description taken in connection with the accompanying drawings, which form a part of this application and in which.

DETAILED DESCRIPTION

Figures 1, 2:
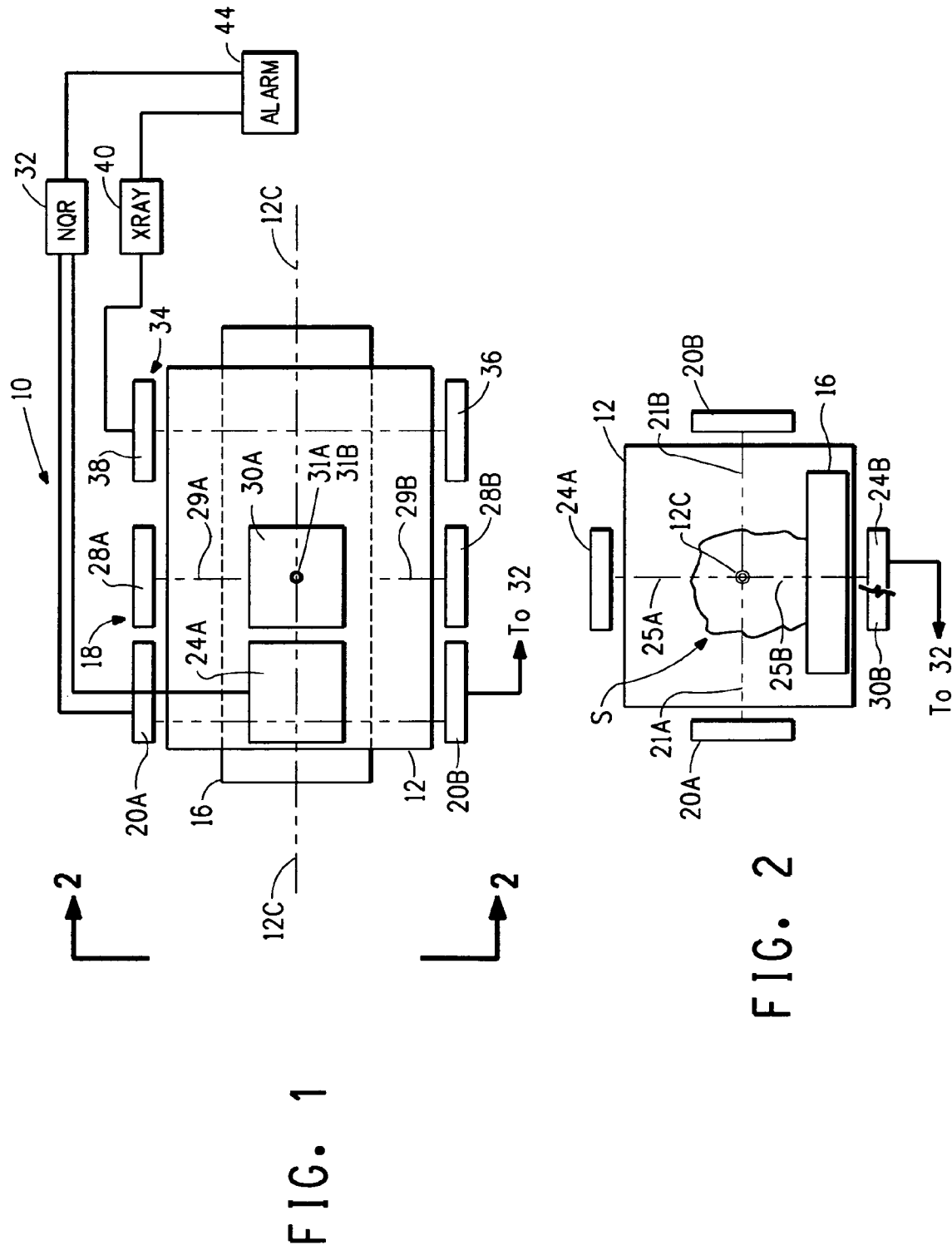
FIG. 1 is a plan view of a combined nuclear quadrupole resonance/X-ray contraband detection system in accordance with the present invention.
FIG. 2 is a front elevational view of the combined nuclear quadrupole resonance/X-ray contraband detection system taken along view lines 2-2 in FIG. 1, with a portion broken away for clarity.

This invention addresses the problem of the detection of contraband shielded by thin metallic coverings in an object being scanned in a combined nuclear quadrupole resonance and X-ray detection system. As is illustrated in FIGS. 1 and 2 a combined detection system generally indicated by the reference character 10 will typically have a tunnel 12 through which the object to be scanned passes. The longitudinal axis, or centerline, of the tunnel 12 is indicated by the reference character 12C. The object is indicated by the reference character S.

As used herein, "tunnel" means an opening in a device that performs the activities of scanning the object S for the detection of the presence of nuclear quadrupole resonance. The object S is passed into, down the length of the longitudinal axis of, and out of the tunnel 12. The object S is scanned for the detection of nuclear quadrupole resonance while it is in the tunnel 12. The cross-section of the tunnel 12, looking down its length, can have various shapes. Typically, as may be seen from FIG. 2, the tunnel 12 will have a rectangular or square cross-section, but the cross-section may be in other shapes such as circular, substantially circular, elliptical or polygonal. Typically, there will be a conveyor belt or other means 16 to transport the object S to be scanned through the tunnel 12, i.e. from one end of the tunnel to the other.

The detection system 10 in accordance with the present invention combines a nuclear quadrupole resonance detection system generally indicated by the reference character 18 and a dual-energy X-ray detection system generally indicated by the reference character 34.

A dual-energy X-ray system 34 is used to distinguish organic, inorganic and metal materials. Thicker metallic items do not transmit X-rays, and the shapes of their opaque, two-dimensional images can aid identification. Guns, knives and other weapons can be identified in this way, even when large portions are made of plastics. Organic materials prove more of a challenge for a dual-energy X-ray detection system, and an object that includes organic material being scanned with an X-ray system may require additional examination for positive identification. The addition of nuclear quadrupole resonance detection capabilities complements those of the X-rays. NQR can identify particular compositions, e.g. specific explosives, biological agents that can be used for bioterrorism, and drugs.

Contraband may, however, be shielded with metal sufficiently thin to be essentially transparent to X-rays but sufficiently thick to prevent detection of the chemical composition by nuclear quadrupole resonance sensors, and this presents a severe detection problem for the combined NQR/X-ray contraband detection system. A shield of 25μ-thick aluminum foil will create the type of problem described above. This invention solves the problem by providing a combined nuclear quadrupole resonance and X-ray contraband detection system with a metal shield alarm that is activated under appropriate circumstances.

The nuclear quadrupole resonance detection system portion 18 of the combined contraband detection system 10 is comprised of at least one pair of sensors 20A, 20B. As used herein, the term "sensor" refers to an NQR detector. Each sensor 20A, 20B is placed so that the line 21A, 21B (FIG. 2) normal to the plane of the respective sensor 20A, 20B is perpendicular to the longitudinal axis, i.e. the centerline 12C, of the tunnel 12. Each sensor 20A, 20B is placed along the side of the tunnel 12.

The reference to a side of a tunnel 12 is used here in the sense of distinguishing the placement of one sensor in a certain location about the wall or perimeter of the tunnel 12 that is different from the location in which another sensor is placed. A tunnel 12 that has a rectangular-shaped, or even polygonal-shaped, cross-section will have flat surfaces that clearly qualify as "sides" of the tunnel in this sense. In a tunnel 12 with a rectangular cross-section, for example, "sides" may refer to the top and bottom walls of the tunnel as well as to the two vertical walls. Even a tunnel 12 with a circular, substantially-circular or elliptical cross-section, however, despite not having flat surfaces in the shape of its cross-section, may be thought of as having "sides" in the sense that the location in which one sensor is placed may be distinguished from the location in which another sensor is placed by reference to other features or attributes that enable distinguishing the location of one "side" from that of another.

A pair of sensors 20A, 20B is arranged directly opposite one another on opposite sides of the tunnel 12 with one sensor 20A of a pair placed on one side of the tunnel 12 and the other sensor 20B of a pair placed on the opposite side of the tunnel 12 facing the first sensor. The normals 21A, 21B to the planes of the respective two sensors of a pair are collinear and the planes of the sensors are parallel.

More than one pair of sensors may be needed in the NQR detection system 18 to provide the desired sensitivity to NQR signals. One additional pair of sensors 24A, 24B is illustrated in the Figures. Similar to the disposition of the sensors in the first pair, each sensor 24A, 24B is placed so that the respective line 25A, 25B (FIG. 2) normal to the plane of the respective sensor 24A, 24B is perpendicular to the longitudinal axis, i.e. the centerline 12C, of the tunnel 12. When more than one pair is used, each pair should be arranged as described above, directly opposite one another. Different pairs of sensors can be arranged on different sides of the tunnel.

The nuclear quadrupole resonance system 18 of the combined contraband detection system 10 in accordance with the present invention includes a suitable excitation coil arrangement. Excitation may be effected using coils separate from the coils performing NQR detection. Alternatively, dual-purpose coils that serve to perform both a detection as well as an excitation functionality may be used.

Preferably, the sensors 20A and 20B (and additional sensors, as sensors 24A, 24B, if used) are used solely to detect the NQR signals and separate excitation coils are used solely to excite the nuclear quadrupole nuclei. Thus, in the Figures, at least a pair of separate excitation coils 28A, 28B is provided. Lines normal to the plane of the excitation coils 28A, 28B are indicated by reference characters 29A, 29B, respectively (FIG. 1). If additional sensors 24A, 24B are used, separate excitation coils 30A, 30B (visible in FIG. 2) may be provided. Lines normal to the plane of the excitation coils 30A, 30B (if provided) are indicated by reference characters 31A, 31B, respectively (FIG. 1).

When separate coils are used for excitation and detection, an excitation coil preferably has the same orientation as the sensors, i.e. along the side of the tunnel wall with the normal to the plane of the coil perpendicular to the axis of the tunnel. Separate excitation coils are preferably arranged in a configuration similar to that used for the sensors, i.e. in pairs, directly opposite one another on opposite sides of the tunnel with one excitation coil of a pair placed on one side of the tunnel and the other excitation coil of a pair placed on the opposite side of the tunnel facing the first coil. Preferably, the normals 29A, 29B to the planes of the two excitation coils 28A, 28B of a pair (and normals 31A, 31B if additional coils 30A, 30B are used) are collinear and the planes of the excitation coils are parallel. Preferably, the sensors and the excitation coils occupy the same sides of the tunnel so that the planes of the pairs of sensors are parallel to the planes of the excitation coils.

In one embodiment, two pairs of excitation coils 28A, 28B and 30A, 30B and at least two pairs of sensors 20A, 20B and 24A, 24B are used. The excitation coils 28A, 28B in the first pair are arranged directly opposite one another on opposite sides of the tunnel 12. The excitation coils 30A, 30B in the second pair are also arranged directly opposite one another on opposite sides of the tunnel 12. The planes of one or both of the excitation coils 28A, 28B in the first pair of excitation coils may thus not be parallel with the planes of one or both of the excitation coils 30A, 30B in the second pair of excitation coils. When those planes are not parallel, they form an angle with each other, and may, for example, be perpendicular to each other.

Each pair of sensors 20A, 20B and 24A, 24B is arranged directly opposite one another on opposite sides of the tunnel with one sensor, e.g., sensor 20A, 24A, of a pair placed on one side of the tunnel and the other sensor, i.e., sensor 20B, 24B, of a pair placed on the opposite side of the tunnel. The sensors are placed on the same sides being occupied by the excitation coils. Thus, each sensor in 20A, 20B in one pair of sensors is arranged on the sides being occupied by the first pair of excitation coils 28A, 28B. Each sensor in 24A, 24B in the other pair of sensors is arranged on the sides being occupied by the second pair of excitation coils 30A, 30B. The planes of one or both of the first pair of sensors may thus not be parallel with the planes of one or both of the second pair of sensors. When those planes are not parallel, they form an angle with each other, and may, for example, be perpendicular to each other.

In a preferred embodiment, the result is two orthogonal pairs of excitation coils and at least two pairs of sensors that are orthogonal. Typically when more than two pairs of sensors are used they would be divided about equally between the two orthogonal positions.

Each of the sensors 20A, 20B (and sensors 24A, 24B, if used) is connected to an NQR analysis circuit 32. The circuit 32 is operative, as will be discussed, to determine the area occupied by a metallic material contained within the object S being scanned.

The excitation coils used in this invention can be made of copper, silver, aluminum or a high temperature superconductor. A copper, silver or aluminum coil is preferably in the form of a shielded-loop resonator (SLR) coil. SLR's have been developed to eliminate the detuning effect of the electrical interaction between the coil and the surrounding material. Preferably, one or more SLR copper excitation coils are used to apply the RF signal to the sample. Preferably, one or more pairs of excitation coils are used and each pair is arranged directly opposite one another on opposite sides of the tunnel.

The sensors are preferably high temperature superconductor self-resonant coils. The high temperature superconductor self-resonant coil is preferably in the form of a self-resonant planar coil, i.e. a surface coil, with a coil configuration of HTS on one or both sides of a substrate. High temperature superconductors are those that superconduct above 77K. The high temperature superconductors used to form the HTS self-resonant coil are preferably selected from the group consisting of $YBa_2Cu_3O_7$, $Tl_2Ba_2CaCu_2O_8$, $TlBa_2Ca_2Cu_3O_9$, $(TlPb)Sr_2CaCu_2O_7$ and $(TlPb)Sr_2Ca_2Cu_3O_9$. Most preferably, the high temperature superconductor is $YBa_2Cu_3O_7$ or $Tl_2Ba_2CaCu_2O_8$.

The dual-energy X-ray portion 34 of the combined detection system 10 includes an X-ray source 36 and an X-ray detector 38. The detector 38 is connected to an X-ray analysis circuit 40 operative to determine the area occupied by a metallic material contained within the object S being scanned.

The dual-energy X-ray portion 34 of the combined detection system 10 is operated in a conventional manner. A dual-energy X-ray system provides the usual identification of metallic, inorganic and organic materials. In addition, the cross sectional area of the two-dimensional image of a metallic object, as measured by the X-rays, is determined. Preferably, the direction of the impinging X-rays is parallel to the normals to the planes of the sensors.

The NQR portion 18 of the combined detection system 10 is also operated in a conventional manner with the sensors detecting any NQR signals from targeted quadrupole nuclei. In addition, the cross sectional area of a metallic object as measured by shifts in the resonance frequency of the sensors is determined. The resonance frequency of a sensor shifts as a result of the presence of metal, e.g. metal in the object being scanned. The magnitude of the frequency shift is a function of the area of the metal seen by the sensor and the position of the metal with respect to the sensor. The larger the metal area, the larger the frequency shift. The closer the metal to the sensor, the larger the frequency shift. By using the frequency shifts of a pair of sensors on opposite sides of the tunnel as described above, the area of a metal object can be determined. The pair of sensors can be calibrated using known samples of metal at various positions to ensure that the calculation of the area of a metal object using the frequency shifts provides an accurate result. When more than one pair of sensors is used, the array of sensor pairs can likewise be calibrated so that the area of metal can be calculated using the sensor frequency shifts.

The area of metal in the object being scanned as determined in the NQR analysis circuit 32 by the resonance frequency shifts of the sensors and the area of metal in the object being scanned as determined by the X-rays analysis circuit 40 are applied to an alarm circuit 44. The utilization of the metallic areas as detected by both the NQR and the X-ray modalities can be used to trigger a metal shield alarm. The situation being addressed is the presence of contraband being shielded by metal sufficiently thin to be essentially transparent to X-rays but sufficiently thick to prevent detection of chemical composition by nuclear quadrupole resonance sensors. The area of metal as determined by the NQR sensor frequency shifts is a total of the area of the thicker metal pieces that the X-rays also measure as well as the area of the thin metal pieces that are essentially transparent to X-rays. The difference between the area of metal as determined by the NQR sensor frequency shifts and the area of metal as determined by X-rays is thus the area of the thin metal pieces. This metal could be shielding contraband, such as sheet explosives, from the sensors.

An alarm is provided with the combined nuclear quadrupole resonance and X-ray contraband detection system, and this alarm is activated when the metal area determined by the NQR sensors exceeds the metal area determined by X-rays by at least a pre-selected amount, which is an amount sufficient to shield contraband. The threshold for activating the metal shield alarm, i.e. the area of metal sufficient to shield contraband, will be determined by the area of metal needed to cover a certain quantity of contraband of particular interest, for example an amount of explosives that can produce a certain amount of damage. For example, the area of metal that is needed to shield an amount of sheet explosives such as RDX that would cause unacceptable damage is readily determined. The threshold for activating the metal shield alarm would then be set at a fraction of the determined area so as to provide a margin of safety.

Other arrangements of sensors and coils useful in this invention are described in U.S. Provisional Application No. 60/635,583, and in the U.S. regular application claiming the benefit thereof (Ser. No. 11/302,549, CL-2895), each of which is incorporated in its entirety as a part hereof for all purposes.

What is claimed is:

1. A detection system to scan an object comprising (a) at least one pair of sensors to detect nuclear quadrupole resonance in the object, (b) an X-ray system to determine the presence of metal in the object, and (c) an alarm that is activated when the area of metal in the object, as determined by resonance frequency shifts of the sensors, exceeds the area of the metal in the object, as determined by X-ray, by at least a pre-selected amount.

2. The detection system of claim 1 further comprising a tunnel, having an axis, through which the object being scanned passes.

3. The detection system of claim 2 wherein each sensor is a planar sensor, and the normal to the plane of the sensor is perpendicular to the axis of the tunnel.

4. The detection system of claim 3 wherein, in a pair of first and second sensors, the first sensor is located on one side of the tunnel and the second sensor is located directly opposite and facing the first sensor on another side of the tunnel, and the normals to the planes of the first and second sensors are collinear and the planes of the sensors are parallel.

5. The detection system of claim 3 further comprising at least one pair of planar excitation coils; wherein each sensor only detects NQR signals, and each excitation coil only excites nuclear quadrupole nuclei.

6. The detection system of claim 5 wherein the normal to the plane of each excitation coil is perpendicular to the axis of the tunnel.

7. The detection system of claim 5 which comprises at least two excitation coils; wherein a first excitation coil is located on one side of the tunnel and a second excitation coil is located directly opposite and facing the first excitation coil on another side of the tunnel, and the normals to the planes of the first and second excitation coils are collinear and the planes of the excitation coils are parallel.

8. The detection system of claim 5 wherein the sensors and the excitation coils occupy the same sides of the tunnel, and the planes of the sensors are parallel to the planes of the excitation coils.

9. The detection system of claim 1 wherein each sensor is a high temperature superconductor self-resonant planar coil.

10. The detection system of claim 5 wherein each excitation coil is a shielded-loop resonator coil.

11. The detection system of claim 5 wherein each sensor is a $YBa_2Cu_3O_7$ or a $Tl_2Ba_2CaCu_2O_8$ high temperature superconductor self-resonant planar coil, and each excitation coil is a copper shielded-loop resonator coil.

12. The detection system of claim 5 wherein an excitation coil applies excitation to an object to be screened for the detection of the presence of explosives, drugs or other contraband.

13. A method for scanning an object to determine the presence therein of a target substance shielded by metal, comprising:
(a) scanning the object with X-rays to determine the area of metal contained in the object;
(b) scanning the object to determine the area of metal contained in the object as measured by the resonance frequency shifts of at least one pair of nuclear quadrupole resonance sensors;
(c) comparing the size of the area of metal determined in step (a) with the size of the area determined in step (b); and
(d) activating an alarm if the area determined in step (b) exceeds the area determined in step (a) by at least a pre-selected amount.

14. The method of claim 13 wherein the object being scanned is passed through a tunnel having an axis.

15. The method of claim 14 wherein each sensor is a planar sensor, and the normal to the plane of the sensor is perpendicular to the axis of the tunnel.

16. The method of claim 14 wherein, in a pair of first and second sensors, the first sensor is located on one side of the tunnel and the second sensor is located directly opposite and facing the first sensor on another side of the tunnel, and the normals to the planes of the first and second sensors are collinear and the planes of the sensors are parallel.

17. The method of claim 14 wherein at least one pair of planar excitation coils excites nuclear quadrupole nuclei in the object, each sensor only detects NQR signals, and each excitation coil only excites nuclear quadrupole nuclei.

18. The method of claim 17 wherein the normal to the plane of each excitation coil is perpendicular to the axis of the tunnel.

19. The method of claim 17 wherein, in a pair of excitation coils, a first excitation coil is located on one side of the tunnel and a second excitation coil is located directly opposite and facing the first excitation coil on another side of the tunnel, and the normals to the planes of the first and second excitation coils are collinear and the planes of the excitation coils are parallel.

20. The method of claim 17 wherein the sensors and the excitation coils occupy the same sides of the tunnel, and the planes of the sensors are parallel to the planes of the excitation coils.

21. The method of claim 13 wherein each sensor is a high temperature superconductor self-resonant planar coil.

22. The method of claim 17 wherein each excitation coil is a shielded-loop resonator coil.

23. The method of claim 17 wherein each sensor is a $YBa_2Cu_3O_7$ or a $Tl_2Ba_2CaCu_2O_8$ high temperature superconductor self-resonant planar coil, and each excitation coil is a copper shielded-loop resonator coil.

24. The method of claim 17 wherein an excitation coil applies excitation to an object to be screened for the detection of the presence of explosives, drugs or other contraband.

* * * * *